United States Patent
Nie et al.

(10) Patent No.: US 12,174,244 B2
(45) Date of Patent: Dec. 24, 2024

(54) DEVICE UNDER TEST SIMULATION EQUIPMENT

(71) Applicant: Teradyne (Asia) Pte. Ltd., Singapore (SG)

(72) Inventors: Min Nie, Shanghai (CN); Yi Hou, Shanghai (CN); Siqiang Jia, Shanghai (CN); Yang Xu, Shanghai (CN); Jun Tang, Shanghai (CN); Yongpeng Mu, Shanghai (CN); Jun Liu, Shanghai (CN); Bo Yu, Shanghai (CN)

(73) Assignee: Teradyne (Asia) Pte. Ltd., Singapore (SG)

( * ) Notice: Subject to any disclaimer, the term of this patent is extended or adjusted under 35 U.S.C. 154(b) by 83 days.

(21) Appl. No.: 18/030,705

(22) PCT Filed: Jul. 22, 2021

(86) PCT No.: PCT/SG2021/050431
§ 371 (c)(1),
(2) Date: Apr. 6, 2023

(87) PCT Pub. No.: WO2022/075918
PCT Pub. Date: Apr. 14, 2022

(65) Prior Publication Data
US 2023/0366922 A1    Nov. 16, 2023

(30) Foreign Application Priority Data

Oct. 10, 2020  (CN) .......................... 202011077492.6

(51) Int. Cl.
*G01R 31/28* (2006.01)
*G01R 31/319* (2006.01)

(52) U.S. Cl.
CPC ... *G01R 31/2834* (2013.01); *G01R 31/31908* (2013.01)

(58) Field of Classification Search
CPC .......... G01R 31/2834; G01R 31/31908; G01R 35/00
(Continued)

(56) References Cited

U.S. PATENT DOCUMENTS 7,580,807 B2   8/2009   Bullock et al.
10,162,007 B2  12/2018  Chan et al.
(Continued)

FOREIGN PATENT DOCUMENTS

KR   10-1999834 B1   7/2019
KR   10-2154362 B1   9/2020

OTHER PUBLICATIONS

International Search Report for International Patent Application No. PCT/SG2021/050431, mailed Oct. 28, 2021, 3 pages.
(Continued)

*Primary Examiner* — Giovanni Astacio-Oquendo
(74) *Attorney, Agent, or Firm* — ArentFox Schiff LLP (57) ABSTRACT

Device under test (DUT) simulation equipment includes: a first circuit board including a first field programmable gate array (FPGA); a second circuit board including a processor; and a power distribution board, wherein the first circuit board is connected to the power distribution board, and the power of the first circuit board is supplied by the power distribution board, wherein the second circuit board is connected to the power distribution board, and the power of the second circuit board is supplied by the power distribution board, wherein when the DUT simulation equipment is connected to a tester to perform testing, the DUT simulation equipment simulates the performance of a DUT providing a response signal after receiving a test signal from the tester, and wherein, in the DUT simulation equipment, only the first
(Continued)

circuit board receives the test signal from the tester, and the second circuit board controls the first circuit board by means of a control signal.

20 Claims, 4 Drawing Sheets

(58) Field of Classification Search
USPC .................................. 324/762.01, 537, 500
See application file for complete search history.

(56) References Cited

U.S. PATENT DOCUMENTS

| 2012/0191402 | A1 | 7/2012 | Filler et al. | |
|---|---|---|---|---|
| 2018/0196103 | A1* | 7/2018 | Champoux | G01R 31/31908 |
| 2019/0353696 | A1* | 11/2019 | Hsu | G01R 31/2834 |
| 2021/0025938 | A1* | 1/2021 | Pöppe | G01R 31/31919 |

OTHER PUBLICATIONS

Written Opinion for International Patent Application No. PCT/SG2021/050431, mailed Oct. 28, 2021, 5 pages.

* cited by examiner

DEVICE UNDER TEST SIMULATION EQUIPMENT

CROSS-REFERENCE TO RELATED APPLICATIONS

This application is a U.S. national stage entry of PCT Application No. PCT/SG2021/050431, which was filed on Jul. 22, 2021. PCT Application No. PCT/SG2021/050431 claims priority to Chinese Patent Application No. 202011077492.6, which was filed on Oct. 10, 2020. This application claims priority to PCT Application No. PCT/SG2021/050431 and to Chinese Patent Application No. 202011077492.6. The contents of PCT/SG2021/050431 and Chinese Patent Application No. 202011077492.6 are incorporated herein by reference.

BACKGROUND

When tested by a tester (such as automatic test equipment (ATE)), a device under test (DUT) provides a response signal after receiving a test signal. However, when the purpose is to operate a tester, it may be inconvenient to acquire a DUT due to the ownership, intellectual property right, or shipping time of the DUT. In addition, a DUT may have complicated functions and thus be costly. Improperly operating and damaging such DUTs leads to high expenses, and the replacement time is long due to the problem of unavailability. In addition, if a DUT does not have a mechanism for preventing improper operation specifically for testing, the possibility of damage is high. Furthermore, a DUT can only correspond to a small number of test features of a tester. If various test features of the tester are to be operated, more types of DUTs are required.

SUMMARY

The present invention simulates, by using device under test (DUT) simulation equipment (such as a circuit board having a field programmable gate array (FPGA)), the response performance of a DUT when tested by a tester (such as automatic test equipment). Thus, the tester can be operated without a physical DUT. Therefore, the cost of operating the tester is low, the time required is short, flexible changes can be made, and a variety of different test features of the tester can be operated. An example of an application of the present invention is that when a tester operator is to be trained, training for operating a tester can be implemented quickly and flexibly at a low cost. In addition, the DUT simulation equipment of the present invention is specially designed for testing, and does not need to have complicated functions that conventional DUTs need to implement. Therefore, the equipment is not costly and is easy to acquire. Furthermore, the DUT simulation equipment of the present invention can change the performance of a simulated DUT in response to different requirements. Therefore, flexible changes can be made to a test, and more types of test features of the tester can also be operated.

In an example of an aspect of the present invention, DUT simulation equipment comprises: a first circuit board comprising a first FPGA; a second circuit board comprising a processor; and a power distribution board, wherein the first circuit board is connected to the power distribution board, and the power of the first circuit board is supplied by the power distribution board, wherein the second circuit board is connected to the power distribution board, and the power of the second circuit board is supplied by the power distribution board, wherein the first circuit board is communicatively connected to the second circuit board, wherein the DUT simulation equipment is configured to store an intellectual property (IP) core corresponding to a simulated DUT, wherein when the DUT simulation equipment is connected to a tester to perform testing, the DUT simulation equipment simulates the performance of the DUT providing a response signal after receiving a test signal from the tester, and wherein, in the DUT simulation equipment, only the first circuit board receives the test signal from the tester, and the second circuit board controls the first circuit board by means of a control signal.

In an example of an aspect of the present invention, regarding the DUT simulation equipment, the first FPGA of the first circuit board is configured to store a first portion of the IP core and the second circuit board is configured to store a second portion of the IP core.

In an example of an aspect of the present invention, regarding the DUT simulation equipment, the cost of the first circuit board is lower than that of the second circuit board.

In an example of an aspect of the present invention, the DUT simulation equipment comprises one or a plurality of first circuit boards and one second circuit board.

In an example of an aspect of the present invention, regarding the DUT simulation equipment, the IP core corresponds to one or a plurality of digital test features and analog test features of the tester.

In an example of an aspect of the present invention, the DUT simulation equipment is capable of storing a plurality of the IP cores.

In an example of an aspect of the present invention, regarding the DUT simulation equipment, the first circuit board further comprises: a per-pin protection circuit group configured to receive a digital test signal, send a digital response signal, and protect the first FPGA from being damaged by a received digital test signal.

In an example of an aspect of the present invention, regarding the DUT simulation equipment, the first circuit board further comprises: an application specific integrated circuit (ASIC) configured to receive an analog test signal and send an analog response signal, and protect the first FPGA from being damaged by a received analog test signal.

In an example of an aspect of the present invention, the ASIC can further be configured to trim voltage or current to increase accuracy.

In an example of an aspect of the present invention, regarding the DUT simulation equipment, the first circuit board further comprises an analog-to-digital converter (ADC), the ASIC is a four-quadrant measurement unit comprising a digital-to-analog converter (DAC), and the ADC converts an analog signal from the first FPGA into a digital signal and transmits the digital signal to the DAC of the four-quadrant measurement unit.

In an example of an aspect of the present invention, regarding the DUT simulation equipment, the first circuit board further comprises a first power regulator configured to regulate the power supplied from the power distribution board.

In an example of an aspect of the present invention, regarding the DUT simulation equipment, the first circuit board actively disconnects from the tester when a test signal exceeding the specification is detected, thereby protecting the first circuit board from being damaged.

In an example of an aspect of the present invention, regarding the DUT simulation equipment, the second circuit board further comprises an Ethernet physical layer (Ethernet PHY) configured to receive update, addition, or deletion information of the IP core from an Ethernet port on the power distribution board, and the second circuit board updates, adds, or deletes the IP core in the DUT simulation equipment by means of the update, addition, or deletion information, comprising updating, adding, or deleting the IP core in the first FPGA of the first circuit board.

In an example of an aspect of the present invention, regarding the DUT simulation equipment, the processor of the second circuit board comprises a second FPGA and a core capable of running an operating system (OS).

In an example of an aspect of the present invention, regarding the DUT simulation equipment, the second FPGA of the second circuit board is configured to store the second portion of the IP core.

In an example of an aspect of the present invention, regarding the DUT simulation equipment, the second circuit board further comprises a second power regulator configured to regulate the power supplied from the power distribution board.

In an example of an aspect of the present invention, an FPGA circuit board is configured to simulate the performance of a DUT providing a response signal after receiving a test signal, the FPGA circuit board comprising: an FPGA; a per-pin protection circuit group configured to receive a digital test signal, send a digital response signal, and protect the FPGA from being damaged by a received digital test signal; an ASIC configured to receive an analog test signal, send an analog response signal, and protect the FPGA from being damaged by a received analog test signal; a power regulator configured to regulate the power received from the power distribution board and to be supplied to the FPGA; and a control connection configured to receive and respond to a control signal from a control circuit board, wherein the FPGA circuit board is configured to store a portion of an IP core corresponding to a simulated DUT, and the IP core corresponds to one or a plurality of digital test features and analog test features of a tester; and wherein when the FPGA circuit board is connected to the tester to perform testing, the FPGA circuit board simulates the performance of the DUT generating a response signal after receiving a test signal from the tester.

In an example of an aspect of the present invention, the FPGA circuit board further comprises an ADC, the ASIC is a four-quadrant measurement unit comprising a DAC, and the ADC converts an analog signal from the FPGA into a digital signal and transmits the digital signal to the DAC of the four-quadrant measurement unit.

In an example of an aspect of the present invention, in the FPGA circuit board, the ASIC can further be configured to trim voltage or current to increase accuracy.

In an example of an aspect of the present invention, the FPGA circuit board is capable of storing a plurality of the IP cores, wherein the IP cores can be updated, added, or deleted by means of update, addition, or deletion information provided by the control circuit board.

In an example of an aspect of the present invention, the cost of the FPGA circuit board is lower than that of the control circuit board.

In an example of an aspect of the present invention, in the FPGA circuit board, each of the IP cores corresponds to a plurality of digital test features and analog test features of the tester.

In an example of an aspect of the present invention, the FPGA circuit board has 10 to 300 digital pins and 2 to 50 analog pins.

Two or a plurality of the above examples of the present invention can be combined in any reasonable manner.

The above content is a non-limiting summary of the present invention, and the present invention is only limited by the content defined by the appended claims and equivalent solutions thereof.

BRIEF DESCRIPTION OF THE DRAWINGS

The accompanying drawings are not intended to be drawn to scale. In the accompanying drawings, each identical or almost identical component shown in the respective drawings is represented by an identical or similar reference numeral. For clarity, it may not be necessary to label every component in every accompanying drawing. In the accompanying drawings.

DETAILED DESCRIPTION

The use of order terms, such as "first" and "second", for modifying elements in the specification and claims does not imply any priority, precedence, or the order of one element relative to another element, or the time sequence of executing method operations. This type of terms is only used as a label to distinguish one element with a certain name from another element with the same name.

The wording and terms used herein are only for description and should not be considered as limiting. The words or phrases "include," "comprise," "have," "contain," and "relate to," and various variations thereof are intended to cover items listed subsequently and other items.

Figure 1:
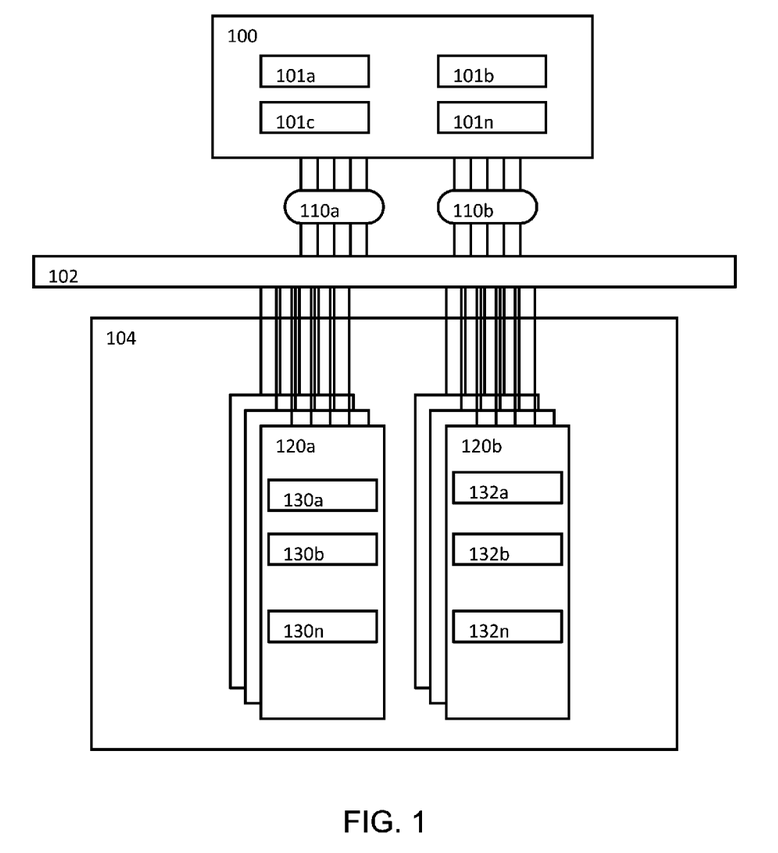
FIG. 1 is a schematic diagram of an example of a connection of DUT simulation equipment during a test according to the present invention.
Figure 2:
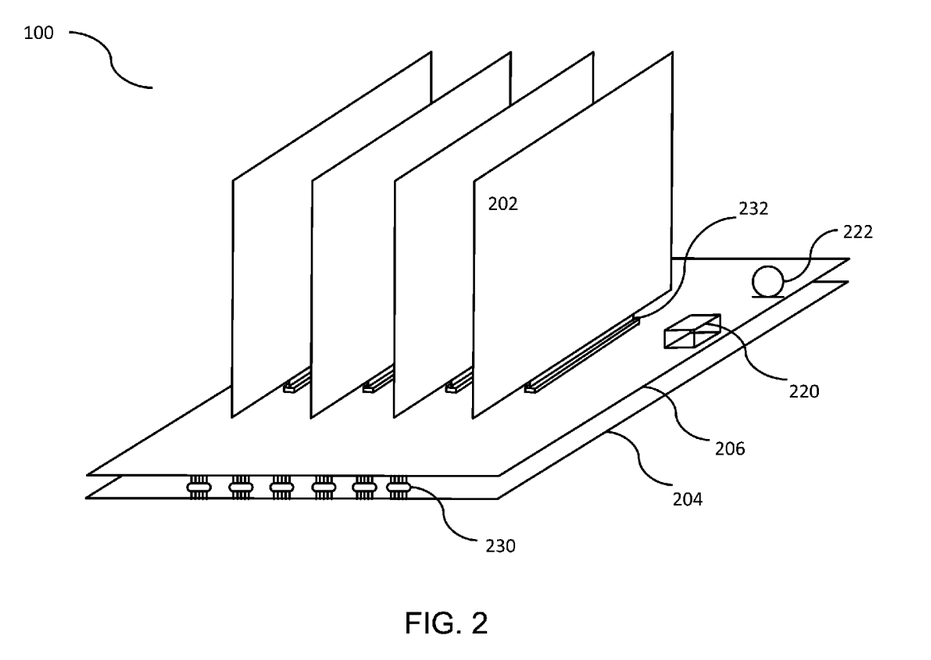
FIG. 2 is a schematic diagram of an example of the DUT simulation equipment according to the present invention.

FIG. 1 is a schematic diagram of an example of a connection of DUT simulation equipment during a test according to the present invention. FIG. 2 is a schematic diagram of an example of the DUT simulation equipment according to the present invention. The present invention is described below with reference to FIG. 1 and FIG. 2. In an example of an aspect of the present invention, when DUT simulation equipment 100 is connected to a tester 104 to perform testing, the DUT simulation equipment 100 simulates the performance of a DUT providing a response signal after receiving a test signal from the tester 104. In an example, the tester 104 may be, for example, automatic test equipment which may have a digital tester 120a and an analog tester 120b. The digital tester 120a may have one or a plurality of digital test features 130a, 130b, . . . , and 130n, and the analog tester 120b may have one or a plurality of analog test features 132a, 132b, . . . , and 132n. In an example, the connection of the DUT simulation equipment 100 is connected to the tester 104 by means of cable sets 110a and 110b passing through a device interface board (DIB) 102.

In an example of an aspect of the present invention, DUT simulation equipment 100 includes: a circuit board 202, a circuit board 204, and a power distribution board 206. The circuit board 202 may be, for example, an FPGA circuit board. The circuit board 202 includes an FPGA. The circuit board 202 is connected to the power distribution board 206, and the power of the circuit board 202 is supplied by the power distribution board 206. For example, the circuit board 202 may be connected to the power distribution board 206 by means of a slot 232 on the power distribution board 206. A connector, such as a high-density connector, is arranged in the slot 232. The circuit board 204 may be, for example, a control circuit board. The circuit board 204 includes a processor. The circuit board 204 is connected to the power distribution board 206, and the power of the circuit board 204 is supplied by the power distribution board 206. For example, the circuit board 204 may be connected to the power distribution board 206 by means of a connector 230, such as a high-density connector. Hence, the power of the circuit board 202 and the power of the circuit board 204 are both supplied by the power distribution board 206 instead of the tester 104, which can prevent an improper operation of the tester 104 (for example, performing various tests, special tests, extreme tests, or performing training of trainees unfamiliar with operations) from damaging the circuit board 202 and the circuit board 204.

In an example, the power distribution board 206 may have an Ethernet interface 220, which may be connected to another computer device. In an example, the power distribution board 206 may have a power supply 222, which can input power to be distributed by the power distribution board 206. The circuit board 202 and the circuit board 204 are communicatively connected, that is, a signal, such as a control signal, can be transmitted between the circuit board 202 and the circuit board 204. For example, the circuit board 202 and the circuit board 204 may be connected by a general-purpose input/output (GPIO). During a test, in the DUT simulation equipment 100, only the circuit board 202 receives a test signal from the tester 104, and the circuit board 204 controls the circuit board 202 by means of a control signal and supports basic functions of the circuit board 202. Hence, it can be ensured that the circuit board 204 is not directly connected to the tester 104, so as to avoid being damaged by the test signal from the tester 104. In an example, the test signal received by the circuit board 202 from the tester 104 may be a digital test signal, an analog test signal, or both.

In an example of an aspect of the present invention, the DUT simulation equipment 100 includes one or a plurality of circuit boards 202 and one circuit board 204. FIG. 2 shows an example of a combination of four circuit boards 202, four slots 232 on the power distribution board 206, and one circuit board 204. In this example, as long as one of the four slots 232 on the power distribution board 206 has a circuit board 202 inserted therein, the circuit board 202 can constitute the DUT simulation equipment 100 along with the circuit board 204. The quantity of the slots 232 of the DUT simulation equipment 100 and the quantity of the circuit boards 202 in the present invention are not limited to this example. For example, the quantity of the slots 232 of the DUT simulation equipment 100 may range from one to dozens, each of the slots 232 may have a circuit board 202 inserted therein or may not have a circuit board 202 inserted therein, but there should be at least one slot 232 having a circuit board 202 inserted therein, the circuit board 202 constituting the DUT simulation equipment 100 along with a corresponding circuit board 204. In an example of an aspect of the present invention, the cost of the circuit board 202 is lower than that of the circuit board 204. For example, various functions other than the function that directly reflects providing a response signal after receiving a test signal may be provided by the circuit board 204. Hence, the cost of replacing the circuit board 202 is low. The circuit board 202 directly receives a test signal from the tester 104, so the risk of damage is high; therefore, lowering the cost of the circuit board 202 can reduce the possible loss incurred when the test signal is abnormal.

In an example of an aspect of the present invention, the DUT simulation equipment 100 is configured to store an IP core 101*a*. In the example in FIG. 1, the DUT simulation equipment 100 can store a plurality of IP cores 101*a*, 101*b*, 101*c*, . . . , and 101*n*. The quantity of the IP cores that can be stored in the DUT simulation equipment 100 of the present invention is not limited to this. For example, the quantity of IP cores that can be stored in the DUT simulation equipment 100 may range from one to hundreds. In an example, one (e.g., 101*a*) of the one or plurality of IP cores 101*a*, 101*b*, 101*c*, . . . , and 101*n* corresponds to a simulated DUT. For one (e.g., 101*a*) of the one or plurality of IP cores 101*a*, 101*b*, 101*c*, . . . , and 101*n*, the FPGA of the circuit board 202 may store a portion of the IP core (i.e., 101*a* in this example) and the circuit board 204 may store the other portion of the IP core (i.e., 101*a* in this example). The portion of the IP core (i.e., 101*a* in this example) stored in the circuit board 202 is a primary portion corresponding to the function of providing a response signal after receiving a test signal, and the other portion stored in the circuit board 204 is a secondary portion corresponding to controlling and supporting. Hence, part of the functions required by the circuit board 202 may be transferred to the circuit board 204, thus reducing the cost of the circuit board 202. In another example, the IP cores are all in the circuit board 202.

In an example of an aspect of the present invention, one (e.g., 101*a*) of the one or plurality of IP cores 101*a*, 101*b*, 101*c*, . . . , and 101*n* corresponds to the one or plurality of digital test feature 130*a*, 130*b*, . . . , and 130*n* and/or the one or plurality of the analog test features 132*a*, 132*b*, . . . , and 132*n* of the tester 104 to be operated. The quantity of the digital test features 130*a*, 130*b*, . . . , and 130*n* and/or the analog test features 132*a*, 132*b*, . . . , and 132*n* corresponding to a single IP core (e.g., 101*a*) of the present invention may be more than that of a conventional DUT, and functions of the corresponding digital test features 130*a*, 130*b*, . . . , and 130*n* and/or analog test features 132*a*, 132*b*, . . . , and 132*n* can be more accurately matched. Therefore, compared with the conventional use of a conventional DUT for testing, the present invention is low in cost, time saving, and accurate.

Figure 3:
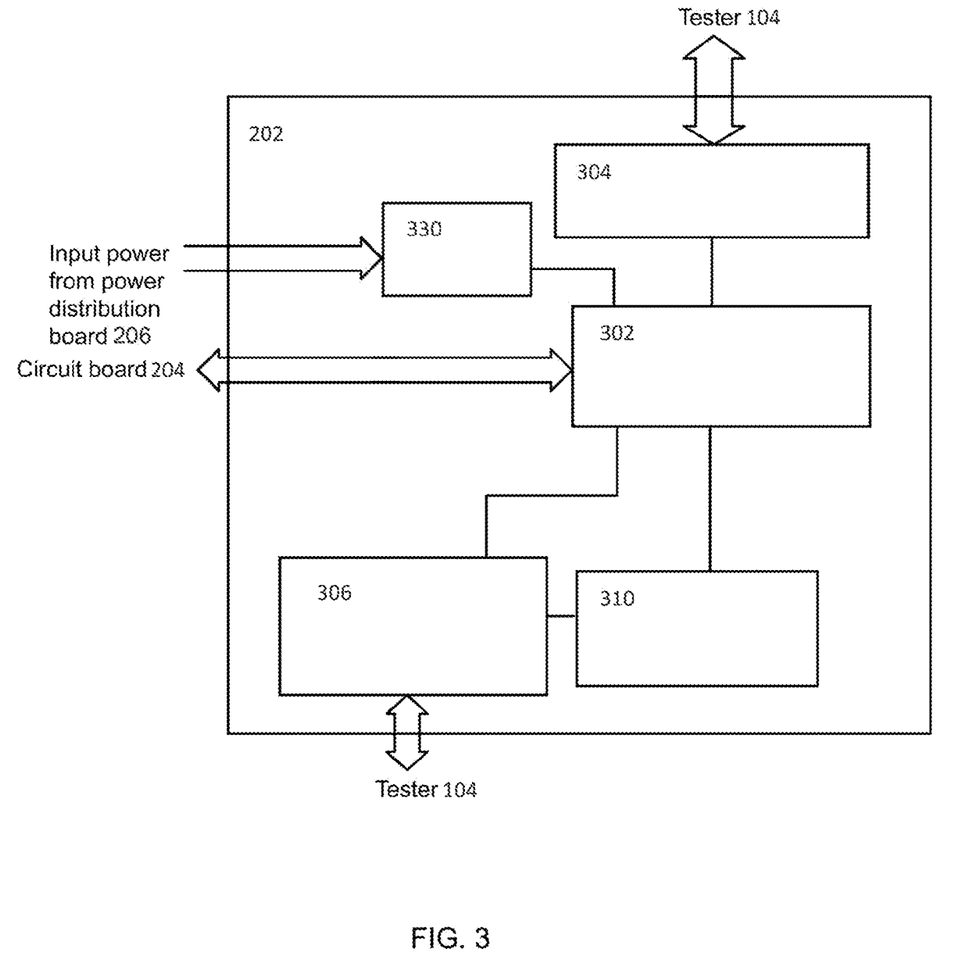
FIG. 3 is a schematic diagram of an example of a circuit board according to the present invention.

FIG. 3 is a schematic diagram of an example of a circuit board 202 (for example, an FPGA circuit board) according to the present invention. The present invention is described below mainly with reference to FIG. 3. In an example of an aspect of the present invention, the circuit board 202 includes an FPGA 302, and the FPGA 302 may be communicatively connected to the circuit board 204 so as to transmit or receive a control signal. In an example of an aspect of the present invention, the circuit board 202 further includes a per-pin protection circuit group 304 configured to receive a digital test signal, send a digital response signal, and protect the FPGA 302 from being damaged by a received digital test signal. In an example of an aspect of the present invention, the circuit board 202 further includes an ASIC 306 configured to receive an analog test signal, send an analog response signal, and protect the FPGA 302 from being damaged by a received analog test signal. In an example of an aspect of the present invention, the ASIC 306 can provide and measure voltage and current. In an example of an aspect of the present invention, the ASIC 306 can further be configured to trim voltage or current to increase accuracy. In an example of the present invention, a combination of the FPGA 302, the per-pin protection circuit group 304, and the ASIC 306 can simulate a power pin of a DUT and simulate a response of the pin of the DUT to a signal. For example, static power consumption, dynamic power consumption, sleep mode power consumption, etc. can be simulated. In an example of the present invention, the circuit board 202 has 10 to 300 digital pins and 2 to 50 analog pins. In an example of the present invention, the circuit board 202 has 70 to 90 digital pins and 6 to 14 analog pins. In an example of the present invention, the circuit board 202 has 80 digital pins and 10 analog pins. The assigned quantity of the pins of the present invention can reach an optimal balance between cost and function. In an example of the present invention, if an incorrect test signal is detected, the circuit board 202 may suspend a test. In an example of the present invention, the circuit board 202 actively disconnects from the tester 104 when a test signal exceeding the specification is detected, thereby protecting the first circuit board from being damaged. Hence, the circuit board 202 can be prevented from being damaged.

In an example of an aspect of the present invention, the circuit board 202 further includes an ADC 310, the ASIC 306 further includes a DAC (for example, the ASIC 306 may be a four-quadrant measurement unit including a DAC), and the ADC 310 converts an analog signal from the FPGA 302 into a digital signal and transmits the digital signal to the DAC of the ASIC 306. In an example of the present invention, a combination of the FPGA 302, the per-pin protection circuit group 304, the ASIC 306, and the ADC 310 can simulate a power pin of a DUT and simulate a response of the power pin of the DUT to a signal. For example, static power consumption, dynamic power consumption, dormant mode power consumption, etc. can be simulated.

In an example of an aspect of the present invention, the circuit board 202 further includes a power regulator 330 configured to regulate the power supplied from the power distribution board 206, which can be input to the FPGA 302. Hence, components on the circuit board 202, especially the FPGA 302 that is sensitive to the input power, can be protected. The power regulator 330 is close to the FPGA 302, thus leading to desirable regulation and protection effects. The power regulator 330 and the circuit board 202 receive power only from the power distribution board 206 instead of receiving power from the tester 104, so that the probability of damage can be reduced. In an example of an aspect of the present invention, the input voltage is several volts to dozens of volts, for example, 19 volts. In an example of an aspect of the present invention, the circuit board 202 further includes peripheral components, such as an electrically erasable read-only memory (EEPROM), a temperature sensor, a timer, a flash memory (FLASH), and a general-purpose input/output (GPIO) connector.

Figure 4:
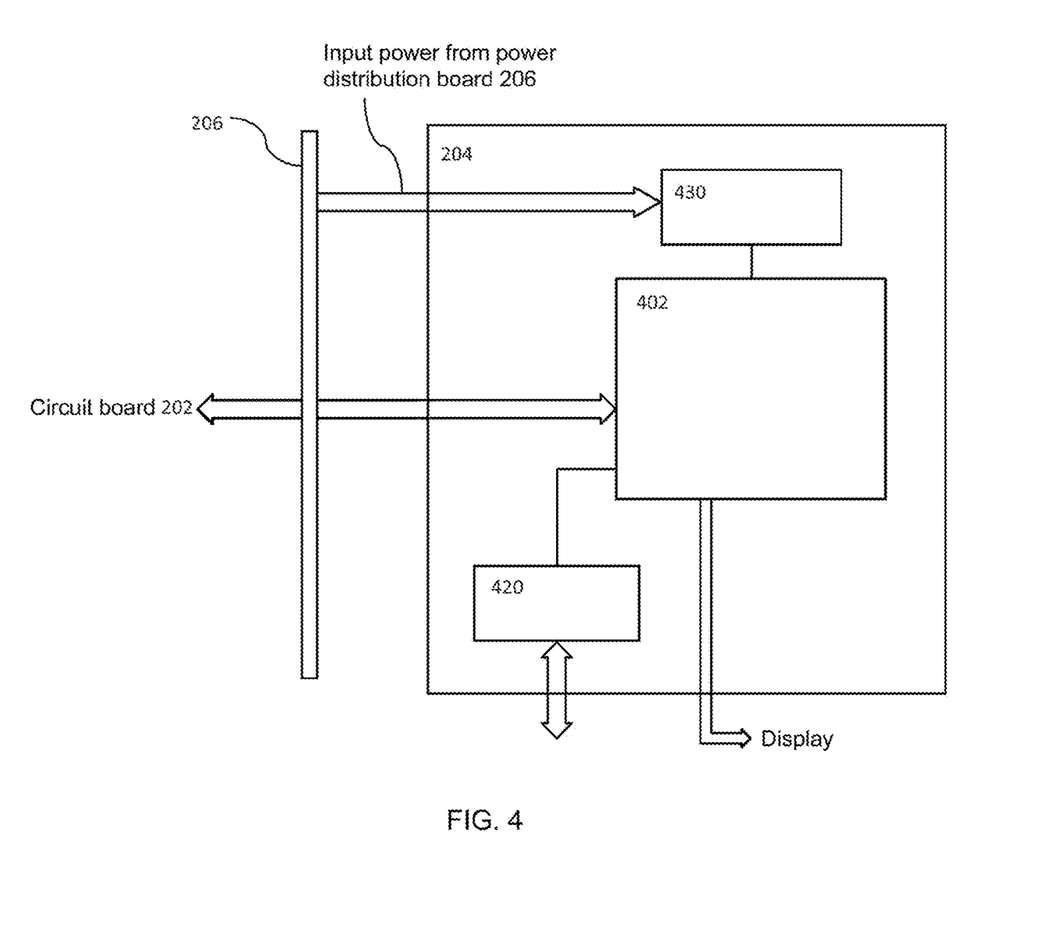
FIG. 4 is a schematic diagram of an example of a circuit board according to the present invention.

FIG. 4 is a schematic diagram of an example of a circuit board 204 (for example, a control circuit board) according to the present invention. The present invention is described below mainly with reference to FIG. 4. In an example of an aspect of the present invention, a processor 402 of the circuit board 204 includes an FPGA and a core capable of running an operating system (OS). The circuit board 204 can control the circuit board 202 by means of a control signal and support basic functions of the circuit board 202. Hence, complicated and diverse functions can be operated on the circuit board 204, and because the circuit board 204 does not directly receive a test signal, the probability of damage thereof is lower than that of the circuit board 202. In an example of an aspect of the present invention, the FPGA of the processor 402 of the circuit board 204 is configured to store the portion of the IP core on the circuit board 204.

In an example of an aspect of the present invention, the circuit board 204 further includes an Ethernet physical layer 420 configured to receive update, addition, or deletion information of the IP core from an Ethernet port on the power distribution board 206. The circuit board 204 updates, adds, or deletes the IP core in the DUT simulation equipment by means of the update, addition, or deletion information, including updating, adding, or deleting the portion of the IP core in the FPGA of the circuit board 202 and/or updating, adding, or deleting the portion of the IP core in the FPGA of the circuit board 204. In an example of an aspect of the present invention, the circuit board 204 further includes a power regulator 430 configured to regulate the power supplied from the power distribution board 206. Hence, components on the circuit board 204, especially the processor 402 that is sensitive to the input power, can be protected. The power regulator 430 is close to the processor 402, thus leading to desirable regulation and protection effects. The power regulator 430 and the circuit board 204 receive power only from the power distribution board 206 instead of receiving power from the tester, so that the probability of damage can be reduced. In an example of an aspect of the present invention, the input voltage is several volts to dozens of volts, for example, 19 volts. In an example of an aspect of the present invention, the circuit board 204 further includes peripheral components, such as a random access memory (RANI), a reset supervisor, a joint test action group (JTAG), an electrically erasable read-only memory (EEPROM), a temperature sensor, a timer, a flash memory (FLASH), a general-purpose input/output (GPIO) connector, and an output to an external display. Hence, complicated and diverse functions can be operated on the circuit board 204.

Referring back to FIG. 3, an example of another aspect of the present invention is described below. In an example of an aspect of the present invention, an FPGA circuit board 202 is configured to simulate the performance of a DUT providing a response signal after receiving a test signal. The FPGA circuit board 202 includes: an FPGA 302; a per-pin protection circuit group 304 configured to receive a digital test signal, send a digital response signal, and protect the FPGA 302 from being damaged by a received digital test signal; an ASIC 306 configured to receive an analog test signal, send an analog response signal, and protect the FPGA 302 from being damaged by a received analog test signal; a power regulator 330 configured to regulate the power received from the power distribution board 206 and to be supplied to the FPGA 302; a control connection configured to receive and respond to a control signal from a control circuit board 204. The FPGA circuit board 202 is configured to store a portion or all of the IP core corresponding to a simulated DUT. The IP core corresponds to one or a plurality of digital test features and analog test features of a tester. When the FPGA circuit board 202 is connected to the tester to perform testing, the FPGA circuit board 202 simulates the performance of the DUT generating a response signal after receiving a test signal from the tester. In an example of an aspect of the present invention, the ASIC 306 can provide and measure voltage and current. In an example of an aspect of the present invention, the ASIC 306 can further be configured to trim voltage or current to increase accuracy. In an example of the present invention, a combination of the FPGA 302, the per-pin protection circuit group 304, and the ASIC 306 can simulate a power pin of a DUT and simulate a response of the pin of the DUT to a signal. For example, static power consumption, dynamic power consumption, dormant mode power consumption, etc. can be simulated. In an example of the present invention, the FPGA circuit board 202 has 10 to 300 digital pins and 2 to 50 analog pins. In an example of the present invention, the FPGA circuit board 202 has 70 to 90 digital pins and 6 to 14 analog pins. In an example of the present invention, the FPGA circuit board 202 has 80 digital pins and 10 analog pins. The assigned quantity of the pins of the present invention can reach an optimal balance between cost and function. In an example of the present invention, if an incorrect test signal is detected, the FPGA circuit board 202 may suspend a test. In an example of the present invention, the FPGA circuit board 202 actively disconnects from the tester when a test signal exceeding the specification is detected, thereby protecting the first circuit board from being damaged. Hence, the FPGA circuit board 202 can be prevented from being damaged. In an example of an aspect of the present invention, the cost of the FPGA circuit board 202 is lower than that of the control circuit board 204, so that, if the FPGA circuit board 202 is damaged, the cost of replacement is lower.

In an example of an aspect of the present invention, each IP core corresponds to a plurality of digital test features and analog test features of a tester to be operated. In an example of an aspect of the present invention, one of the one or plurality of IP cores corresponds to one or a plurality of the digital test features and/or the one or plurality of the analog test features of the tester to be operated. The quantity of the digital test features and/or analog test features corresponding to a single IP of the present invention can be more than that of a conventional DUT, and functions of the corresponding digital test features and/or analog test features can be more accurately matched. Therefore, compared with the conventional use of a conventional DUT for testing, the present invention is low in cost, time saving, and accurate. In an example of an aspect of the present invention, the FPGA circuit board 202 can store a plurality of IP cores, wherein the IP cores can be updated, added, or deleted by means of update, addition, or deletion information provided by the control circuit board 204.

In an example of an aspect of the present invention, the FPGA circuit board 202 further includes an ADC 310, the ASIC 306 further includes a DAC (for example, the ASIC 306 may be a four-quadrant measurement unit including a DAC), and the ADC 310 converts an analog signal from the FPGA 302 into a digital signal and transmits the digital signal to the DAC of the ASIC 306. In an example of the present invention, a combination of the FPGA 302, the per-pin protection circuit group 304, the ASIC 306, and the ADC 310 can simulate a power pin of a DUT and simulate a response of the power pin of the DUT to a signal. For example, static power consumption, dynamic power consumption, dormant mode power consumption, etc. can be simulated. In an example of an aspect of the present invention, the FPGA circuit board 202 further includes peripheral components, such as an electrically erasable read-only memory (EEPROM), a temperature sensor, a timer, a flash memory (FLASH), and a general-purpose input/output (GPIO) connector.

The examples and aspects of the present invention can be appropriately combined or modified, as long as these combinations and modifications fall within the spirit and scope of the present invention.

The description of the specification is only illustrative and is not intended to be limiting. The present invention is limited only by the content defined by the appended claims and equivalent solutions thereof.

The invention claimed is:

1. Device under test (DUT) simulation equipment, comprising:
   a first circuit board comprising a first field programmable gate array (FPGA);
   a second circuit board comprising a processor; and
   a power distribution board;
   wherein the first circuit board is connected to the power distribution board, the power distribution board power is configured to supply power to the first circuit board, the second circuit board is connected to the power distribution board, and the power distribution board is configured to supply power to the second circuit board;
   wherein the first circuit board is communicatively connected to the second circuit board;
   wherein the DUT simulation equipment is configured to store an intellectual property (IP) core corresponding to a simulated DUT;
   wherein, when the DUT simulation equipment is connected to a tester configured to perform testing by outputting a test signal, the DUT simulation equipment is configured to simulate a performance of a DUT by providing a response signal after receiving the test signal from the tester; and
   wherein only the first circuit board is configured to receive the test signal from the tester, and the second circuit board is configured to control the first circuit board using a control signal.

2. The DUT simulation equipment of claim 1, wherein the first FPGA is configured to store a first portion of the IP core, and the second circuit board is configured to store a second portion of the IP core.

3. The DUT simulation equipment of claim 2, wherein the processor of the second circuit board comprises a second FPGA and a core configured to run an operating system (OS), and
   wherein the second FPGA is configured stores the second portion of the IP core.

4. The DUT simulation equipment of claim 1, wherein a cost of the first circuit board is lower than a cost of the second circuit board; and
   wherein the DUT simulation equipment comprises one or more instances of the first circuit board and one instance of the second circuit board.

5. The DUT simulation equipment of claim 1, wherein the IP core corresponds to one or more digital test features of the tester and one or more analog test features of the tester, and
   wherein the DUT simulation equipment stores a plurality of the IP cores.

6. The DUT simulation equipment of claim 1, wherein the first circuit board further comprises:
   a per-pin protection circuit group configured to receive a digital test signal as the test signal, to send a digital response signal as the response signal, and to protect the first FPGA from being damaged by a received digital test signal; and
   an application specific integrated circuit (ASIC) configured to receive an analog test signal as the test signal, to send an analog response signal as the response signal, and to protect the first FPGA from being damaged by a received analog test signal, the ASIC being configured to trim a voltage or a current of a signal.

7. The DUT simulation equipment of claim 6, wherein the first circuit board further comprises an analog-to-digital converter (ADC);

wherein the ASIC is a four-quadrant measurement unit comprising a digital-to-analog converter (DAC);

wherein the ADC is configured to convert an analog signal from the first FPGA into a digital signal and to transmit the digital signal to the DAC; and wherein the first circuit board further comprises a first power regulator configured to regulate the power supplied from the power distribution board.

8. The DUT simulation equipment of claim 1, wherein the first circuit board is configured to actively disconnect from the tester when the test signal exceeds a specification.

9. The DUT simulation equipment of claim 1, wherein the second circuit board further comprises an Ethernet physical layer (Ethernet PHY) configured to receive update, addition, or deletion information of the IP core from an Ethernet port on the power distribution board; and wherein the second circuit board is configured to update, to add, or to delete the IP core in the DUT simulation equipment based on the update, addition, or deletion information.

10. A circuit board configured to simulate performance of a device under test (DUT) by providing a response signal after receiving a test signal, the circuit board comprising:

a field programmable gate array (FPGA);

a per-pin protection circuit group configured to receive a digital test signal, to send a digital response signal, and to protect the FPGA from being damaged by a received digital test signal;

an application specific integrated circuit (ASIC) configured to receive an analog test signal, to send an analog response signal, and to protect the FPGA from being damaged by a received analog test signal;

a power regulator configured to regulate power to be supplied to the FPGA that is received from a power distribution board; and a control connection configured to receive and to respond to a control signal from a control circuit board, wherein the circuit board is configured to store a portion of an intellectual property (IP) core corresponding to a simulated DUT; and wherein the IP core corresponds to one or more digital test features and analog test features of a tester; and wherein, when the circuit board is connected to the tester to receive the test signal, the circuit board is configured to simulate performance of the DUT generating the response signal after receiving the test signal from the tester.

11. The circuit board of claim 10, wherein the circuit board further comprises:

an analog-to-digital converter (ADC), the ASIC being a four-quadrant measurement unit comprising a digital-to-analog converter (DAC), and the ADC for converting an analog signal from the FPGA into a digital signal and for transmitting the digital signal to the DAC, and wherein the ASIC is configured to trim voltage or current of a signal.

12. The circuit board of claim 10, wherein the circuit board stores a plurality of the IP cores, and wherein the control circuit board is configured to update, to add, or to delete information from the IP cores based on update, addition, or deletion information.

13. The circuit board of claim 12, wherein a cost of the circuit board is lower than a cost of the control circuit board, and wherein each of the IP cores corresponds to at least one of the plurality of digital test features and analog test features of the tester.

14. The circuit board of claim 10, further comprising:

10 to 300 digital pins; and 2 to 50 analog pins.

15. Device under test (DUT) simulation equipment, comprising:

a first circuit board;

a second circuit board;

a power distribution board; and a connection to a tester configured to perform testing by outputting a test signal;

wherein the first circuit board is connected to the power distribution board, the power distribution board power is configured to supply power the first circuit board, the second circuit board is connected to the power distribution board, and the power distribution board is configured to supply power to the second circuit board;

wherein the first circuit board is configured to receive the test signal from the tester;

wherein the DUT simulation equipment is configured to simulate a performance of a DUT by providing a response signal to the tester following receipt of the test signal; and wherein the second circuit board is configured to control the first circuit board using a control signal.

16. The DUT simulation equipment of claim 15, wherein the second circuit board comprises a processor;

wherein the first circuit board comprises a field programmable gate array (FPGA) storing a first portion of an IP core;

wherein the second circuit board stores a second portion of the IP core; and wherein the first portion is for providing the response signal following receipt of the test signal and the second portion is for providing the control signal.

17. The DUT simulation equipment of claim 16, wherein the IP core corresponds to one or more digital test features of the tester and one or more analog test features of the tester, and wherein the DUT simulation equipment stores a plurality of the IP cores.

18. The DUT simulation equipment of claim 15, wherein the DUT simulation equipment comprises one or more instances of the first circuit board and one instance of the second circuit board.

19. The DUT simulation equipment of claim 16, wherein the first circuit board further comprises:

a per-pin protection circuit group configured to receive a digital test signal as the test signal, to send a digital response signal as the response signal, and to protect the FPGA from being damaged by a received digital test signal; and an application specific integrated circuit (ASIC) configured to receive an analog test signal as the test signal, to send an analog response signal as the response signal, and to protect the first FPGA from being damaged by a received analog test signal, the ASIC being configured to trim a voltage or a current of a signal.

20. The DUT simulation equipment of claim 16, wherein the first circuit board further comprises an analog-to-digital converter (ADC);

wherein the ASIC is a four-quadrant measurement unit comprising a digital-to-analog converter (DAC);

wherein the ADC is configured to convert an analog signal from the FPGA into a digital signal and to transmit the digital signal to the DAC; and wherein the first circuit board further comprises a first power regulator configured to regulate the power supplied from the power distribution board.

\* \* \* \* \*